(12) United States Patent
Khanna et al.

(10) Patent No.: US 12,081,182 B2
(45) Date of Patent: Sep. 3, 2024

(54) CURRENT SENSE AMPLIFIER

(71) Applicant: TEXAS INSTRUMENTS INCORPORATED, Dallas, TX (US)

(72) Inventors: Ankit Khanna, Tucson, AZ (US); Dimitar Trifonov, Vail, AZ (US); Partha Basu, Oro Valley, AZ (US); Chase Puglisi, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 134 days.

(21) Appl. No.: 18/049,831

(22) Filed: Oct. 26, 2022

(65) Prior Publication Data

US 2024/0146266 A1 May 2, 2024

(51) Int. Cl.
| | |
|---|---|
| *G11C 7/06* | (2006.01) |
| *H02P 23/14* | (2006.01) |
| *H03F 3/45* | (2006.01) |
| *H03K 3/037* | (2006.01) |
| *H03K 19/20* | (2006.01) |

(52) U.S. Cl.
CPC .......... *H03F 3/45475* (2013.01); *G11C 7/06* (2013.01); *H02P 23/14* (2013.01); *H03K 3/037* (2013.01); *H03K 19/20* (2013.01); *H03F 2200/462* (2013.01); *H03F 2200/474* (2013.01)

(58) Field of Classification Search
CPC ............ H03K 3/037; H03K 5/01; H03K 5/02; H03K 19/20; H03F 3/45475; H03F 2200/462; H03F 2200/474; G11C 7/06; G11C 7/062; G11C 7/08; H02P 23/14
See application file for complete search history.

(56) References Cited

U.S. PATENT DOCUMENTS

| | | | |
|---|---|---|---|
| 9,882,482 B1 * | 1/2018 | Hendry | .................. H02M 3/158 |
| 2022/0247372 A1 * | 8/2022 | Xu | ....................... H03F 3/45946 |

* cited by examiner

*Primary Examiner* — Long Nguyen
(74) *Attorney, Agent, or Firm* — Valerie M. Davis; Frank D. Cimino

(57) ABSTRACT

A current sense amplifier includes a first amplifier stage, a second amplifier stage, a switch, and a common-mode transient detector. The first amplifier stage has a first amplifier output, a second amplifier output, a first amplifier input, and a second amplifier input. The second amplifier stage has a third amplifier input coupled to the first amplifier output, and a fourth amplifier input coupled to the second amplifier output. The switch has a switch control input, a first switch terminal coupled to the third amplifier input, and a second switch terminal coupled to the fourth amplifier input. The common-mode transient detector circuit has a detector output, a first detector input and a second detector input. The detector output is coupled to the switch control input. The first detector input is coupled to the first amplifier input. The second detector input is coupled to the second amplifier input.

20 Claims, 4 Drawing Sheets

CURRENT SENSE AMPLIFIER

BACKGROUND

Many electronic circuit applications require measurement of electrical currents. For example, efficient operation of electric machines, such as electric motors, powered by three phase inverters often requires control of the individual phase currents generated by the inverters. Measurement of the individual phase currents is an initial step in controlling the motor. In one technique for measuring a current flowing through a conductor, a low-resistance shunt resistor is inserted into the current path, and the voltage across the shunt resistor is measured using a current sense amplifier. The voltage across the shunt resistor is proportional to the current flowing through the shunt resistor. A current sense amplifier is a voltage difference amplifier that is designed for sensing the differential voltage across a shunt resistor while rejecting large input common-mode voltages. A current sense amplifier may have an input common-mode voltage range that extends above, and sometimes below, its power supply voltages.

SUMMARY

In one example, a current sense amplifier includes a first amplifier stage, a second amplifier stage, a switch, and a common-mode transient detector circuit. The first amplifier stage has a first amplifier output, a second amplifier output, a first amplifier input, and a second amplifier input. The second amplifier stage has a third amplifier input and a fourth amplifier input. The third amplifier input is coupled to the first amplifier output, and the fourth amplifier input is coupled to the second amplifier output. The switch has a first switch terminal, a second switch terminal, and a switch control input. The first switch terminal is coupled to the third amplifier input. The second switch terminal is coupled to the fourth amplifier input. The common-mode transient detector circuit has a detector output, a first detector input and a second detector input. The detector output is coupled to the switch control input. The first detector input is coupled to the first amplifier input. The second detector input is coupled to the second amplifier input.

In another example, a current sense amplifier includes a first amplifier stage, a second amplifier stage, and a common-mode transient detector circuit. The first amplifier stage has a first amplifier output, a second amplifier output, a first amplifier input, and a second amplifier input. The first amplifier stage is configured to sense a current flowing between the first amplifier input and the second amplifier input. The second amplifier stage has a third amplifier input, a fourth amplifier input, and a third amplifier output. The third amplifier input is coupled to the first amplifier output. The fourth amplifier input is coupled to the second amplifier output. The second amplifier stage is configured to provide, at the third amplifier output, a voltage representative of the current flowing between the first amplifier input and the second amplifier input. The common-mode transient detector circuit has a first detector input and a second detector input. The first detector input is coupled to the first amplifier input. The second detector input is coupled to the second amplifier input. The common-mode transient detector circuit is configured to detect a change in common-mode voltage at the first amplifier input and the second amplifier input, and reduce a bandwidth of the second amplifier stage responsive to the change in the common-mode voltage.

In a further example, a motor drive circuit includes a power stage, a shunt resistor, and a current sense amplifier. The shunt resistor has a first shunt terminal and a second shunt terminal. The first shunt terminal coupled to the power stage. The current sense amplifier includes a first amplifier stage, a second amplifier stage, a switch, and a common-mode transient detector circuit. The first amplifier stage has a first amplifier output, a second amplifier output, a first amplifier input, and a second amplifier input. The first amplifier input is coupled to the first shunt terminal. The second amplifier input is coupled to the second shunt terminal. The second amplifier stage has a third amplifier input, and a fourth amplifier input. The third amplifier input is coupled to the first amplifier output. The fourth amplifier input is coupled to the second amplifier output. The switch has a first switch terminal, a second switch terminal, and a switch control input. The first switch terminal is coupled to the third amplifier input. The second switch terminal is coupled to the fourth amplifier input. The common-mode transient detector circuit has a detector output, a first detector input, and a second detector input. The detector output is coupled to the switch control input. The first detector input is coupled to the first amplifier input. The second detector input is coupled to the second amplifier input.

BRIEF DESCRIPTION OF THE DRAWINGS

The same reference numbers or other reference designators are used in the drawings to designate the same or similar (functionally and/or structurally) features.

DETAILED DESCRIPTION

When a large and fast common-mode voltage transient is present at the inputs of a current sense amplifier circuit, the internal circuits of the amplifier that are biased relative to the input common-mode voltage will lag the transient in reaching new bias points, due to charging of parasitic capacitances. During this re-biasing interval, the amplifier may temporarily operate outside of its valid operating region resulting in a disturbance or "glitch" in a current sense signal provided at the amplifier's output. To avoid improper operation, some circuits using the current sense signal may be designed to ignore glitches caused by common-mode voltage transients. Alternatively, some current sense amplifiers attempt to passively reduce the effects of common-mode voltage transients by providing fully symmetric signal paths with matched parasitic capacitances from amplifier input to amplifier output. However, providing symmetric signal paths requires trimming (and trim circuitry) that increases circuit area and production cost.

The current sense amplifier described herein includes two amplifier stages and a common-mode transient detection circuit. The common-mode transient detection circuit detects common-mode voltage transients at the inputs of the first amplifier stage, and temporarily reduces the bandwidth of the second amplifier stage responsive to detection of a common-mode voltage transient. The bandwidth of the second amplifier stage may be reduced for a time selected to block the effects of the transient at the output of the current sense amplifier. Reducing the bandwidth of the second amplifier stage effectively holds the output of the second amplifier stage at the pre-transient output voltage, thereby preventing a common-mode transient induced disturbance at the output of the first amplifier stage from propagating to the output of the current sense amplifier.

Figure 1:
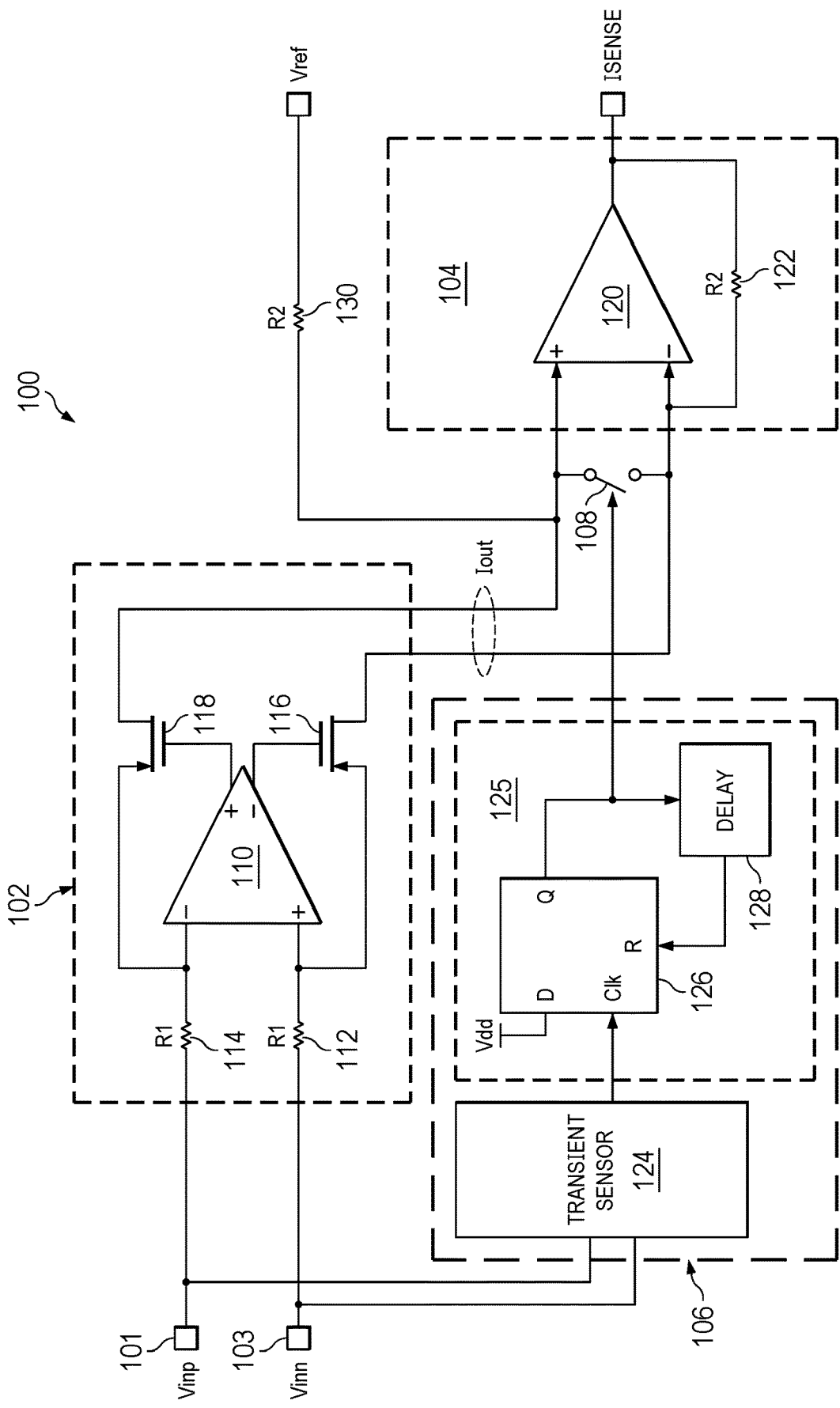
FIG. 1 is a block diagram of an example current sense amplifier circuit that detects common-mode transients and reduces amplifier bandwidth responsive to detection of a common-mode transient.

FIG. 1 is a block diagram of an example current sense amplifier circuit 100 that detects common-mode transients and reduces amplifier bandwidth responsive to detection of a common-mode transient. The current sense amplifier circuit 100 includes a first amplifier stage 102, a second amplifier stage 104, a common-mode transient detection circuit 106, and a switch 108. The first amplifier stage 102 includes a fully differential amplifier 110, a resistor 112 (having, for example, a resistance equal to or approximately equal to R1), a resistor 114 (having, for example, a resistance equal to or approximately equal to R1), a transistor 116, and a transistor 118. The first amplifier stage 102 receives the (differential) input voltages Vinp and Vinn, and provides a differential output current that is proportional to the difference of Vinp and Vinn. The resistor 114 is coupled between an input terminal 101 and a first input (e.g., an inverting input or "−" input) of the differential amplifier 110. The resistor 112 is coupled between an input terminal 103 and a second input (e.g., a non-inverting input or "+" input) of the differential amplifier 110. A first output (e.g., an inverting output) of the differential amplifier 110 is coupled to a control terminal (e.g., gate) of the transistor 116. A first current terminal (e.g., source) of the transistor 116 is coupled to the second input of the differential amplifier 110. A second output (e.g., a non-inverting output) of the differential amplifier 110 is coupled to a control terminal (e.g., gate) of the transistor 118. A first current terminal (e.g., source) of the transistor 118 is coupled to the first input of the differential amplifier 110. The first amplifier stage 102 provides the differential output current at the second current terminal (e.g., drain) of the transistor 116 and the second current terminal (e.g., drain) of the transistor 118. The transistor 116 and the transistor 118 may be p-channel field effect transistors (PFETs).

The differential amplifier 110 controls the transistor 116 and the transistor 118, which are connected to provide negative feedback at the inputs of the differential amplifier 110. As a voltage difference is applied across the input terminal 101 and the input terminal 103 (Vinp−Vinn), the negative feedback drops the voltage across the resistor 112 and the resistor 114 while equalizing the voltage at the inputs of the differential amplifier 110. The voltage drop across the resistor 112 and the resistor 114 creates a differential current (Vinp−Vinn)/R1 that flows through the transistor 116 and the transistor 118.

The second amplifier stage 104 includes an amplifier 120 and a resistor 122 (having, for example, a resistance of R2). The second amplifier stage 104 converts the differential current received from the first amplifier stage 102 to a single-ended output voltage (ISENSE) that is proportional to Vinp−Vinn (which is proportional to a current flowing between the input terminal 101 and the input terminal 103). A first input (e.g., an inverting input) of the amplifier 120 is coupled to the second current terminal (e.g., a drain) of the transistor 116. A second input (e.g., a non-inverting input) of the amplifier 120 is coupled to the second current terminal (e.g., a drain) of the transistor 118. The resistor 122 is coupled between the output of the amplifier 120 and the first input of the amplifier 120. A reference voltage that sets an offset of ISENSE may be applied to the second input of the amplifier 120 via a resistor 130 (having, for example, a resistance equal to or approximately equal to R2), which is coupled to a reference voltage circuit (not shown) that supplies reference voltage Vref. The transimpedance gain of the second amplifier stage 104 is approximately R2, and the overall gain of the current sense amplifier circuit 100 is approximately R2/R1.

A common-mode voltage transient present at the input terminal 101 and the input terminal 103, temporarily disrupts the internal circuits of the differential amplifier 110, and a transitory error occurs in the differential current provided to the second amplifier stage 104. To inhibit propagation of the error to ISENSE, the common-mode transient detection circuit 106 detects the common-mode voltage transient and closes the switch 108 thereby causing switch 108 to be conducting (and causing the first and second inputs of amplifier to be connected to each other. The switch 108 includes a first switch terminal coupled to the first input of the amplifier 120, a second switch terminal coupled to the second input of the amplifier 120, and a switch control input coupled to the common-mode transient detection circuit 106. When the switch 108 is closed, the signal inputs of the amplifier 120 are connected through a low resistance, which dramatically reduces (e.g., reduces to near zero) the loop gain of the second amplifier stage 104. The decrease in loop gain has the effect of reducing the bandwidth of the second amplifier stage 104. In this state, the second amplifier stage 104 will react very slowly to changes at its inputs, and will effectively appear to enter a hold state where it maintains the output voltage provided before the switch 108 was closed. Accordingly, closing the switch 108 prevents the second amplifier stage 104 from changing ISENSE responsive to the transitory error in the differential current.

The common-mode transient detection circuit 106 includes a transient sensor circuit 124 and a pulse generator circuit 125. The transient sensor circuit 124 includes a first sensor input coupled to the input terminal 101 and second sensor input coupled to the input terminal 103. The transient sensor circuit 124 senses a common-mode voltage transient at the input terminal 101 and the input terminal 103, and generates an output signal that triggers the pulse generator circuit 125. A pulse output of the pulse generator circuit 125 is coupled to the switch control input of the switch 108. An input (also referred to as a pulse input) of the pulse generator circuit 125 coupled to an output (also referred to as a sensor output) of the transient sensor circuit 124. The pulse generator circuit 125 includes a flip-flop 126 (e.g., a D flip-flop or other equivalent circuit) and a delay circuit 128. A clock input of the flip-flop 126 is coupled to an output of the transient sensor circuit 124. A rising edge of the signal provided by the transient sensor circuit 124 clocks the flip-flop 126 (to set the flip-flop output signal to a logic high) when the transient sensor circuit 124 detects a common-mode voltage transient. A flip-flop output of the flip-flop 126 is coupled to the switch control input of the switch 108. When the flip-flop output signal is a logic high, the switch 108 is closed, and the bandwidth of the second amplifier stage 104 is reduced.

The flip-flop output signal remains at a logic high for the duration of a delay provided by the delay circuit 128. The flip-flop output of the flip-flop 126 is coupled to a delay input of the delay circuit 128, and a delay output of the delay circuit 128 is coupled to a reset input of the flip-flop 126. The delay circuit 128 resets the flip-flop 126 at expiration of the delay, and the switch 108 is opened to increase the bandwidth of the second amplifier stage 104. The delay may be selected to keep the switch 108 closed for the duration of the disturbance in the differential current provided by the first amplifier stage 102. The delay circuit 128 may be implemented using a counter in some implementations of the common-mode transient detection circuit 106. For example, a reset input of the counter is coupled to the output the flip-flop 126, and the output of the counter is coupled to the reset input of the flip-flop 126. When the output signal of the flip-flop 126 goes to a logic high, the counter starts counting and counts to a preselected value. On reaching the preselected value, the counter output signal resets the flip-flop. Other examples of the delay circuit 128 may include a different delay implementation. In some implementations of the delay circuit 128, the delay provided may be configurable at manufacture or testing of the device using fuses or memory, or user configurable via a communication interface or other selection method.

Figure 2:
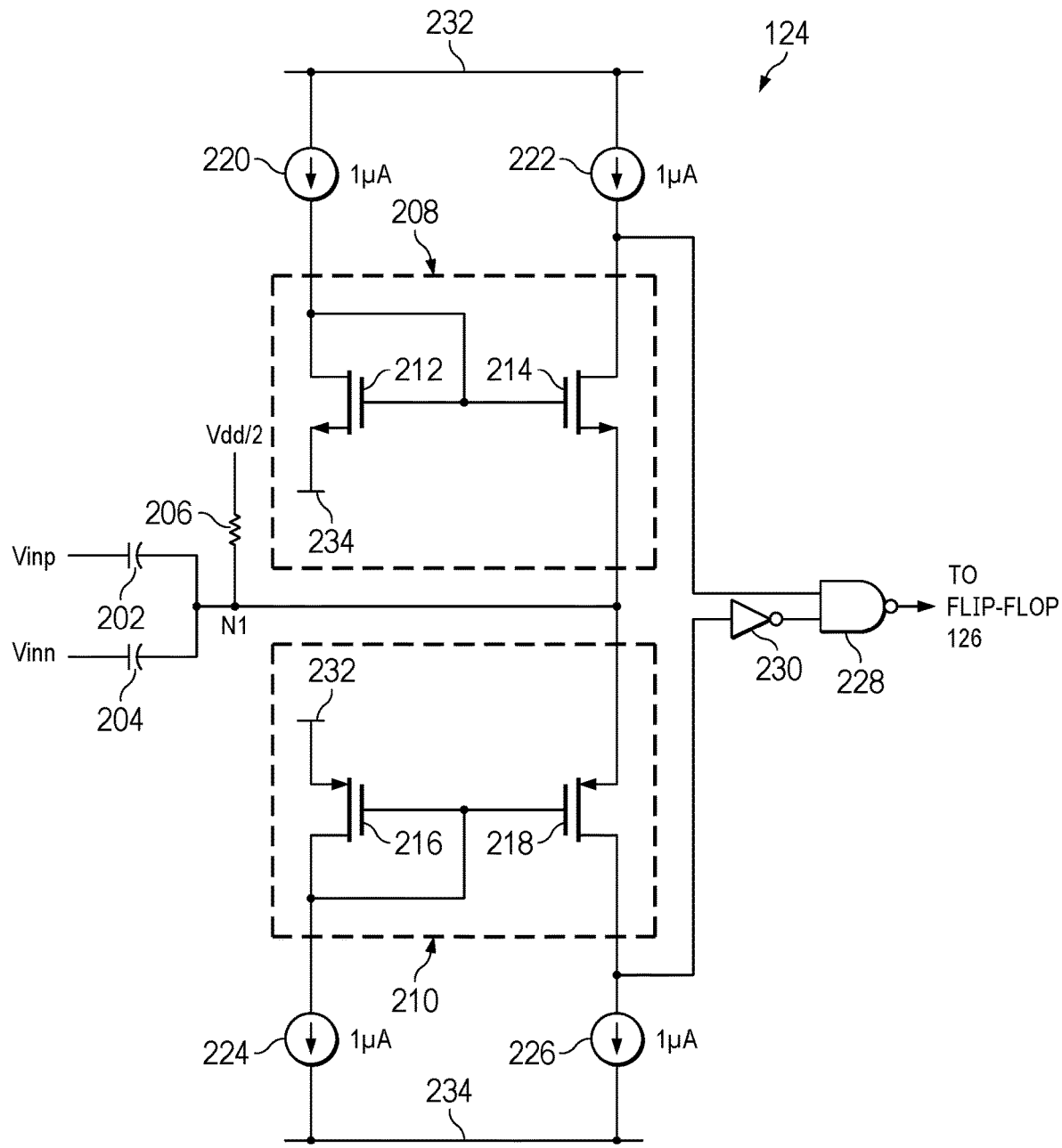
FIG. 2 is schematic level diagram of an example transient sensor circuit suitable for use in the current sense amplifier circuit of FIG. 1.

FIG. 2 is schematic level diagram of an example transient sensor circuit 124. The transient sensor circuit 124 includes capacitors 202 and 204, a resistor 206, current mirror circuits 208 and 210, current sources 220, 222, 224, and 226, a logic gate 228 (e.g., a NAND gate), and an inverter 230. The capacitor 202 capacitively couples the input terminal 101 to the internal node N1 of the transient sensor circuit 124, and the capacitor 204 capacitively couples the input terminal 103 to the internal node N1 of the transient sensor circuit 124. A first terminal of the capacitor 202 is coupled to the input terminal 101. A first terminal of the capacitor 204 is coupled to the input terminal 103. A second terminal of the capacitor 202 is coupled to a second terminal of the capacitor 204 and to the internal node N1. The resistor 206 pulls the internal node N1 to a preselected voltage. For example, a first resistor terminal of the resistor 206 is coupled to a reference voltage terminal or a reference voltage circuit (not shown) that provides a voltage that is approximately VDD/2, and the second resistor terminal of the resistor 206 is coupled to the internal node N1 to pull the internal node N1 to around VDD/2. When a common-mode voltage transient is present on the input terminal 101 and the input terminal 103, charge transferred via the capacitor 202 and the capacitor 204 causes the voltage on internal node N1 to increase or decrease (for a positive or negative transient) and then decay back to the voltage set by the resistor 206. The change in the voltage of the internal node N1, due to the common-mode voltage transient, causes the transient sensor circuit 124 to produce an output pulse as described below.

The current mirror circuit 208 and the current mirror circuit 210 are coupled to the internal node N1. When the voltage on the internal node N1 increases or decreases, due to a common-mode voltage transient, current flow through the current mirror circuit 208 or the current mirror circuit 210 produces a rising edge (e.g., a logic low voltage to logic high voltage transition of a transient detected signal) at the output of the logic gate 228 to clock the flip-flop 126. A gate output of the logic gate 228 is coupled to a clock input of the flip-flop 126. After the common-mode voltage transient, as the voltage on the internal node N1 decays, the output of the logic gate 228 returns to a logic low voltage.

The current mirror circuit 208 includes a transistor 212 and a transistor 214. The transistor 212 and the transistor 214 may be n-channel field effect transistors (NFETs). The transistor 212 is diode-connected, with a first current terminal (e.g., drain) coupled to a control terminal (e.g., gate) of the transistor 212, and to a power terminal 232 via the current source 220. A second current terminal (e.g., source) of the transistor 212 is coupled to a common potential (e.g., ground) terminal 234. The transistor 214 includes a first current terminal (e.g., drain) coupled to a first gate input of the logic gate 228 and to the power terminal 232 via the current source 222. A control terminal (e.g., gate) of the transistor 214 is coupled to the control terminal of the transistor 212. A second current terminal (e.g., source) of the transistor 214 is coupled to the internal node N1. The current source 220 and the current source 222 may source a current of about 1 microampere in some implementations of the transient sensor circuit 124. When no common-mode voltage transient is present at the input terminal 101 and the input terminal 103, the voltage on the internal node N1 is as set by the resistor 206, the transistor 214 is turned off, and a logic high voltage is provided at the first current terminal of the transistor 214 and the first input of the logic gate 228. A negative common-mode voltage transient (higher to lower common-mode voltage) reduces the voltage on the internal node N1 causing the transistor 214 to turn "on" (e.g., transistor 214 is conducting), and provide a logic low voltage at the first current terminal of the transistor 214 and first input of the logic gate 228. The transition from logic high to logic low voltage at the first input of the logic gate 228 produces a rising edge at the output of the logic gate 228 to clock the flip-flop 126, and reduce the bandwidth of the second amplifier stage 104.

The current mirror circuit 210 includes a transistor 216 and a transistor 218. The transistor 216 and the transistor 218 may be PFETs. The transistor 216 is diode-connected, with a first current terminal (e.g., drain) coupled to a control terminal (e.g., gate) of the transistor 216, and coupled to the ground terminal 234 via the current source 224. A second current terminal (e.g., source) of the transistor 216 is coupled to the power terminal 232 (e.g., a voltage source with a voltage around Vdd, such as approximately 1.8V to 5V or higher depending on the application). The transistor 218 includes a first current terminal (e.g., drain) coupled to a second input of the logic gate 228 (via the inverter 230), and coupled to the ground terminal 234 via the current source 226. A control terminal (e.g., gate) of the transistor 218 is coupled to the control terminal of the transistor 216. A second current terminal (e.g., source) of the transistor 218 is coupled to the internal node N1. The current source 224 and the current source 226 may sink a current of about 1 microampere in some implementations of the transient sensor circuit 124. When no common-mode voltage transient is present at the input terminal 101 and the input terminal 103, the voltage on the internal node N1 is set by the resistor 206 and the voltage source connected to it (e.g., Vdd/2), the transistor 218 is turned "off" (e.g., the transistor is not conducting), a logic low voltage is provided at the first current terminal of the transistor 218, and inverted by the inverter 230 to present a logic high voltage at the second gate input of the logic gate 228. A positive common-mode voltage transient (lower to higher common-mode voltage) increases the voltage on the internal node N1 causing the transistor 218 to turn "on," and provide a logic high voltage at the first current terminal of the transistor 218 and a logic low voltage at the second input of the logic gate 228. The transition from logic high to logic low voltage at the second input of the logic gate 228 produces a rising edge at the output of the logic gate 228 to clock the flip-flop 126, and reduce the bandwidth of the second amplifier stage 104.

The transient sensor circuit 124 may be configured to detect common-mode voltage transients above a selected magnitude and rate of change by selecting the magnitude of the currents provided by the current sources 220, 222, 224, and 226, and the sizing of the transistors 212, 214, 216, and 218.

Figure 3:
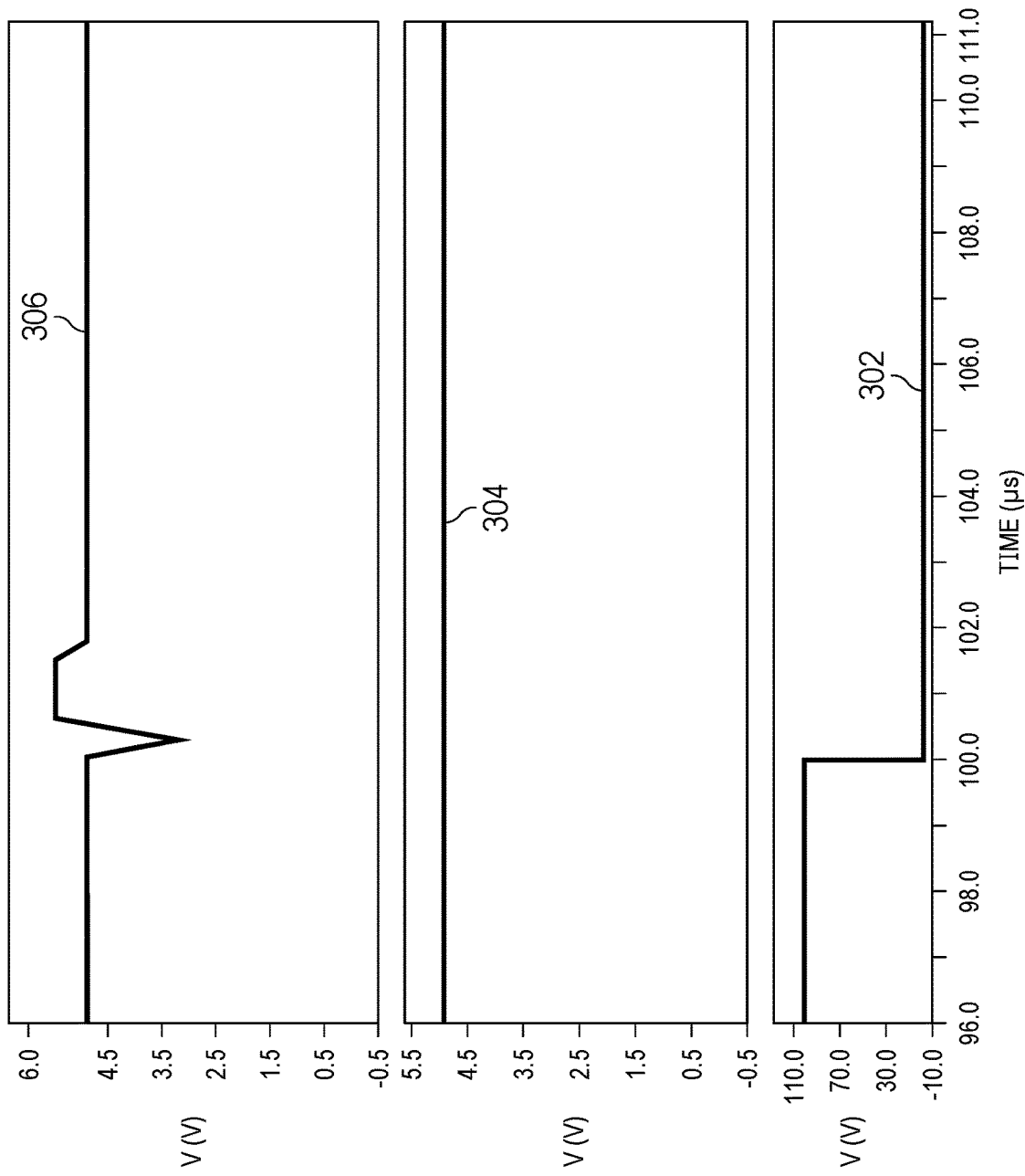
FIG. 3 is a voltage versus time diagram of example current sense amplifier output signals with and without the common-mode transient detection circuit shown in FIG. 1.

FIG. 3 is a diagram of current sense amplifier output signals with and without the common-mode transient detection circuit 106. In FIG. 3, the x-axis is time (in microseconds), and the y-axis is voltage scaled for each signal. The common-mode voltage 302 is provided to the current sense amplifier circuit 100 and to a current sense amplifier that lacks the common-mode transient detection circuit 106. At about 100 microseconds, the common-mode voltage 302 quickly falls from about 100 volts to about −4 volts (a large common-mode voltage transient is present). The signal 306 is ISENSE provided by the current sense amplifier that lacks the common-mode transient detection circuit 106. Responsive to the change in the common-mode voltage 302, the signal 306 exhibits a transient of about 3 volts in magnitude and 1-1.5 microseconds in duration. The signal 304 is ISENSE provided by the current sense amplifier circuit 100 (which includes, for example, common-mode transient detection circuit 106 and the related circuitry as depicted in FIGS. 1 and 2). The current sense amplifier circuit 100 detects and rejects the common-mode voltage transient. No transient is visible in the signal 304 at the illustrated scale.

Figure 4:
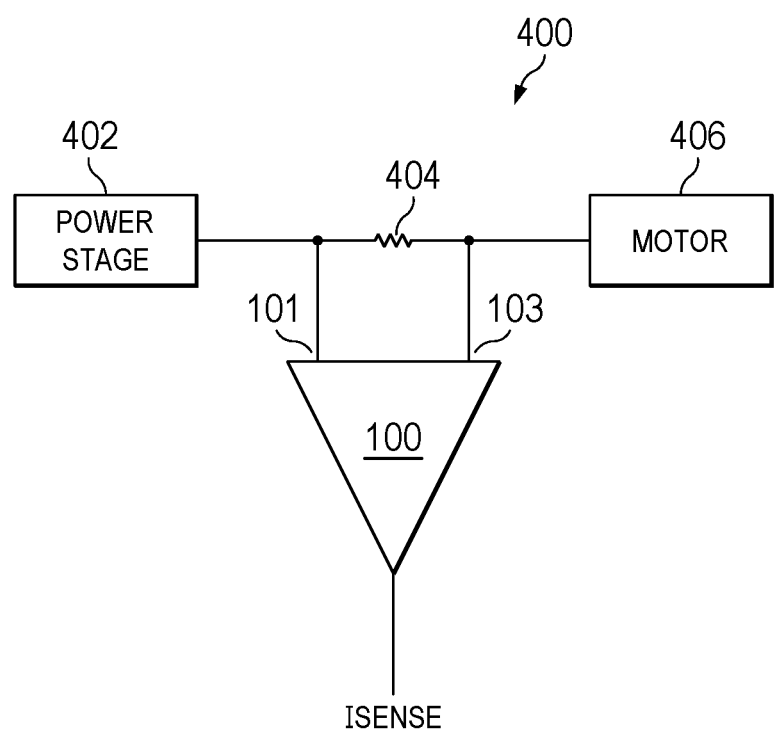
FIG. 4 is a block diagram of an example motor control circuit that includes the current sense amplifier circuit of FIG. 1.

FIG. 4 is a block diagram of a motor control circuit 400 that includes the current sense amplifier circuit 100. The motor control circuit 400 includes a power stage 402, a shunt resistor 404, a motor 406, and the current sense amplifier circuit 100. The power stage 402 may be a half-bridge circuit configured to drive a winding of the motor 406. In some examples, three motor control circuits 400 may be present to drive/control a three-phase motor, where a separate combination of resistor 404/current sense amplifier circuit 100 is connected to each winding of the motor 406. Switching of the power stage 402 may be controlled by a pulse width modulation circuit (not shown) in some implementations of the motor control circuit 400. The power stage 402 switches voltage at the output of the power stage 402 between two power supply voltages (e.g., 96 volts and 0 volts), producing large common-mode voltage transients. The shunt resistor 404 is coupled between the power stage 402 and the motor 406 (a winding of the motor 406). The shunt resistor 404 may have a resistance of one milli-ohm or less. The input terminal 101 of the current sense amplifier circuit 100 is coupled to a first terminal of the shunt resistor 404, and the input terminal 103 of the current sense amplifier circuit 100 is coupled to a second terminal of the shunt resistor 404. The current sense amplifier circuit 100 senses the common-mode voltage transients at the input terminal 101 and the input terminal 103, and provides the current sense signal ISENSE (representative of the current flowing through the shunt resistor 404) without errors caused by the common-mode voltage transients.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal," "node," "interconnection," "pin," and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors, or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its current terminals. In the context of a FET, the control input is the gate, and the current terminals are the drain and source. In the context of a BJT, the control input is the base, and the current terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. A current sense amplifier comprising:
   a first amplifier stage having a first amplifier output, a second amplifier output, a first amplifier input, and a second amplifier input;
   a second amplifier stage having:
      a third amplifier input coupled to the first amplifier output;
      a fourth amplifier input coupled to the second amplifier output;
   a switch having:
      a first switch terminal coupled to the third amplifier input;
      a second switch terminal coupled to the fourth amplifier input; and
      a switch control input;
   a common-mode transient detector circuit having:
      a detector output coupled to the switch control input;
      a first detector input coupled to the first amplifier input; and
      a second detector input coupled to the second amplifier input.

2. The current sense amplifier of claim 1, wherein the common-mode transient detector circuit includes:
   a transient sensor circuit having:
      a sensor output;
      a first sensor input coupled to the first amplifier input; and
      a second sensor input coupled to the second amplifier input; and
   a pulse generator circuit having:
      a pulse output coupled to the switch control input; and
      a pulse input coupled to the sensor output.

3. The current sense amplifier of claim 2, wherein the pulse generator circuit includes:
   a flip-flop having:
      a flip-flop output coupled to the switch control input;
      a clock input coupled to the sensor output; and
      a reset input; and
   a delay circuit having:
      a delay input coupled to the flip-flop output; and
      a delay output coupled to the reset input.

4. The current sense amplifier of claim 2, wherein the transient sensor circuit includes:
   a resistor including:
      a first resistor terminal coupled to a reference voltage terminal; and
      a second resistor terminal;
   a first capacitor coupled between the second resistor terminal and the first amplifier input;
   a second capacitor coupled between the second resistor terminal and the second amplifier input;
   a first current mirror circuit coupled between a power terminal and the second resistor terminal;
   a second current mirror circuit coupled between a ground terminal and the second resistor terminal; and
   a logic gate having:
      a gate output coupled to the pulse input;
      a first gate input coupled to the first current mirror circuit; and
      a second gate input coupled to the second current mirror circuit.

5. The current sense amplifier of claim 4, wherein:
   the first current mirror circuit includes:
      a first transistor having:
         a first current terminal;
         a second current terminal coupled to the ground terminal; and
         a first control terminal coupled to the first current terminal;
      a second transistor having:
         a third current terminal coupled to the first gate input;
         a fourth current terminal coupled to the second resistor terminal; and
         a second control terminal coupled to the first control terminal; and
   the transient sensor circuit includes:
      a first current source coupled between the power terminal and the first current terminal; and
      a second current source coupled between the power terminal and the third current terminal.

6. The current sense amplifier of claim 4, wherein:
   the second current mirror circuit includes:
      a first transistor having:
         a first current terminal coupled to the power terminal;
         a second current terminal; and
         a first control terminal coupled to the second current terminal;
      a second transistor having:
         a third current terminal coupled to the second resistor terminal;
         a fourth current terminal coupled to the second gate input; and
         a second control terminal coupled to the first control terminal; and the transient sensor circuit includes:
a first current source coupled between the ground terminal and the second current terminal; and
a second current source coupled between the ground terminal and the fourth current terminal.

7. The current sense amplifier of claim 1, the first amplifier stage includes:
an amplifier having:
an inverting input coupled to the first detector input;
a non-inverting input coupled to the second detector input;
an inverting output; and
a non-inverting output;
a first transistor having:
a first current terminal coupled to the inverting input;
a second current terminal coupled to the third amplifier input; and
a first control terminal coupled to the non-inverting output; and
a second transistor having:
a third current terminal coupled to the non-inverting input;
a fourth current terminal coupled to the fourth amplifier input; and
a second control terminal coupled to the inverting output.

8. A current sense amplifier comprising:
a first amplifier stage having a first amplifier output, a second amplifier output, a first amplifier input, and a second amplifier input, the first amplifier stage configured to sense a current flowing between the first amplifier input and the second amplifier input;
a second amplifier stage having:
a third amplifier input coupled to the first amplifier output;
a fourth amplifier input coupled to the second amplifier output; and
a third amplifier output;
in which the second amplifier stage is configured to provide, at the third amplifier output, a voltage representative of the current flowing between the first amplifier input and the second amplifier input; and
a common-mode transient detector circuit having:
a first detector input coupled to the first amplifier input; and
a second detector input coupled to the second amplifier input;
in which the common-mode transient detector circuit is configured to:
detect a change in common-mode voltage at the first amplifier input and the second amplifier input; and
reduce a bandwidth of the second amplifier stage responsive to the change in the common-mode voltage.

9. The current sense amplifier of claim 8, wherein the first amplifier stage is configured to provide at the first amplifier output and the second amplifier output, a differential current representative of the current flowing between the first amplifier input and the second amplifier input.

10. The current sense amplifier of claim 8, wherein:
the common-mode transient detector circuit includes:
a transient sensor circuit configured to detect the change in the common-mode voltage; and
a pulse generator circuit configured to provide a pulse responsive to detection of the change in the common-mode voltage; and
the current sense amplifier includes a switch configured to connect the third amplifier input and the fourth amplifier input responsive to the pulse.

11. The current sense amplifier of claim 10, wherein the transient sensor circuit includes:
a first current mirror circuit configured to conduct a first current responsive to a transient increase in the common-mode voltage; and
a second current mirror circuit configured to conduct a second current responsive to a transient decrease in the common-mode voltage.

12. The current sense amplifier of claim 11, wherein the transient sensor circuit includes:
a first capacitor configured to capacitively couple the first amplifier input to the first current mirror circuit and the second current mirror circuit; and
a second capacitor configured to capacitively couple the second amplifier input to the first current mirror circuit and the second current mirror circuit.

13. The current sense amplifier of claim 11, wherein the transient sensor circuit includes a logic gate coupled to the first current mirror circuit and the second current mirror circuit, the logic gate configured to provide a transient detected signal responsive to the first current or the second current.

14. The current sense amplifier of claim 13, wherein:
the pulse generator circuit is configured to provide the pulse responsive to the transient detected signal; and
the pulse generator circuit includes
a flip-flop configured to provide the pulse; and
a delay circuit coupled to the flip-flop, the delay circuit configured to set a width of the pulse.

15. A motor drive circuit comprising:
a power stage;
a shunt resistor having a first shunt terminal and a second shunt terminal, the first shunt terminal coupled to the power stage;
a current sense amplifier including:
a first amplifier stage having a first amplifier output, a second amplifier output, a first amplifier input, and a second amplifier input, in which:
the first amplifier input is coupled to the first shunt terminal; and
the second amplifier input is coupled to the second shunt terminal;
a second amplifier stage having:
a third amplifier input coupled to the first amplifier output;
a fourth amplifier input coupled to the second amplifier output;
a switch having:
a first switch terminal coupled to the third amplifier input;
a second switch terminal coupled to the fourth amplifier input; and
a switch control input;
a common-mode transient detector circuit having:
an output coupled to the switch control input;
a first detector input coupled to the first amplifier input; and
a second detector input coupled to the second amplifier input.

16. The motor drive circuit of claim 15, wherein the common-mode transient detector circuit includes:
- a transient sensor circuit having:
  - a sensor output;
  - a first sensor input coupled to the first amplifier input; and
  - a second sensor input coupled to the second amplifier input; and
- a pulse generator circuit having:
  - a pulse output coupled to the switch control input; and
  - a pulse input coupled to the sensor output.

17. The motor drive circuit of claim 16, wherein the transient sensor circuit includes:
- a resistor including:
  - a first resistor terminal coupled to a reference voltage terminal; and
  - a second resistor terminal;
- a first capacitor coupled between the second resistor terminal and the first amplifier input;
- a second capacitor coupled between the second resistor terminal and the second amplifier input;
- a first current mirror circuit coupled between a power terminal and the second resistor terminal;
- a second current mirror circuit coupled between a ground terminal and the second resistor terminal; and
- a logic gate having:
  - a gate output coupled to the pulse input;
  - a first gate input coupled to the first current mirror circuit; and
  - a second gate input coupled to the second current mirror circuit.

18. The motor drive circuit of claim 17, wherein:
the first current mirror circuit includes:
- a first transistor having:
  - a first current terminal;
  - a second current terminal coupled to the ground terminal; and
  - a first control terminal coupled to the first current terminal;
- a second transistor having:
  - a third current terminal coupled to the first gate input;
  - a fourth current terminal coupled to the second resistor terminal; and
  - a second control terminal coupled to the first control terminal; and the transient sensor circuit includes:
- a first current source coupled between the power terminal and the first current terminal; and
- a second current source coupled between the power terminal and the third current terminal.

19. The motor drive circuit of claim 17, wherein:
the second current mirror circuit includes:
- a first transistor having:
  - a first current terminal coupled to the power terminal;
  - a second current terminal; and
  - a first control terminal coupled to the second current terminal;
- a second transistor having:
  - a third current terminal coupled to the second resistor terminal;
  - a fourth current terminal coupled to the second gate input; and
  - a second control terminal coupled to the first control terminal; and the transient sensor circuit includes:
- a first current source coupled between the ground terminal and the second current terminal; and
- a second current source coupled between the ground terminal and the fourth current terminal.

20. The motor drive circuit of claim 16, wherein the pulse generator circuit includes:
- a flip-flop having:
  - a flip-flop output coupled to the switch control input;
  - a clock input coupled to the sensor output; and
  - a reset input; and
- a delay circuit having:
  - a delay input coupled to the flip-flop output; and
  - a delay output coupled to the reset input.

* * * * *